United States Patent [19]

Flood

[11] Patent Number: 4,479,250
[45] Date of Patent: Oct. 23, 1984

[54] DUAL AUDIO CAPTURE LIMITER SQUELCH CIRCUIT

[75] Inventor: Steven P. Flood, Hoffman Estates, Ill.

[73] Assignee: Motorola, Inc., Schaumburg, Ill.

[21] Appl. No.: 503,207

[22] Filed: Jun. 10, 1983

[51] Int. Cl.³ .............................................. H04B 1/10
[52] U.S. Cl. .................................... 455/213; 455/221; 455/309; 455/312; 381/94
[58] Field of Search ............................... 455/210–213, 455/218, 221, 222, 308, 309, 312; 329/129, 130, 134; 381/94, 104

[56] References Cited

U.S. PATENT DOCUMENTS

| | | |
|---|---|---|
| 3,102,236 | 8/1963 | Eichenberger et al. . |
| 3,196,354 | 7/1965 | Engelbrecht . |
| 3,250,999 | 5/1966 | Cole . |
| 3,478,272 | 11/1969 | Rogers . |
| 3,568,068 | 3/1971 | Russell, Jr. . |
| 3,584,304 | 6/1971 | Casterline . |
| 3,626,294 | 12/1971 | Dancy . |
| 3,628,058 | 12/1971 | Espe .................................... 307/235 |
| 3,660,765 | 5/1972 | Glasser et al. . |
| 3,678,416 | 7/1972 | Burwen .................................. 381/94 |
| 3,701,028 | 10/1972 | Markevich ........................... 381/94 |
| 3,719,892 | 3/1973 | Yamazaki et al. . |
| 3,753,159 | 8/1973 | Burwen .................................. 381/94 |
| 3,769,592 | 10/1973 | Espe . |
| 3,783,387 | 1/1974 | Wernli . |
| 3,873,926 | 3/1975 | Wright . |
| 4,087,756 | 5/1978 | Rogers, Jr. ........................... 329/50 |
| 4,208,548 | 6/1980 | Orban ................................... 381/94 |
| 4,256,975 | 3/1981 | Fukushima et al. ................ 455/309 |
| 4,359,780 | 11/1982 | Day ..................................... 455/222 |
| 4,371,981 | 2/1983 | King et al. .......................... 455/219 |
| 4,426,735 | 1/1984 | Kasperkovitz ...................... 455/213 |

Primary Examiner—Jin F. Ng
Attorney, Agent, or Firm—Joan Pennington; James W. Gillman; Edward R. Roney

[57] ABSTRACT

A communications receiver squelch circuit for use in frequency modulation systems which has tight squelch sensitivity. The squelch circuit includes two audio limiters and provides improved squelch sensitivity and squelch action that is independent of carrier modulation and significantly minimizes squelch clamping and squelch boost characteristics.

5 Claims, 3 Drawing Figures

DUAL AUDIO CAPTURE LIMITER SQUELCH CIRCUIT

FIELD OF THE INVENTION

This invention relates generally to squelch circuitry used for preventing a radio receiver from producing audio-frequency output in the absence of a carrier signal, and more particularly is directed to squelch circuitry for use in frequency modulation (F.M.) systems wherein tight squelch sensitivity is desired.

DESCRIPTION OF THE PRIOR ART

In radio receivers, particularly in high gain communication receivers, it is common practice to employ squelch circuits operative to block off the audio output in the absence of transmitted intelligence signal, so that receiver noise will not be heard during intervals between signal reception. When a signal is received, the audio output of the receiver is enabled by the squelch circuit, thereby allowing the signal to be heard.

Squelch sensitivity is a measure of the ability of the squelch circuit to distinguish between a signal condition and a no-signal condition and is defined in relation to the radio frequency (R.F.) signal strength required for the squelch circuit to enable the audio output of the receiver. Prior art squelch circuits generally have a sensitivity level which is inadequate or only marginally adequate to distinguish between the signal condition and the no-signal condition, thus providing at times inaccurate squelch operation.

Other problems with prior art squelch circuitry generally include squelch clamping and squelch boost. Squelch clamping is the undesired operation of the squelch circuit which prevents audio-frequency output of the communications receiver with the carrier signal present with modulation added. The addition of modulation on the R.F. carrier causes a noise rise during narrowband FM detection. The result of this noise rise is that squelch clamping occurs. To open the squelch circuit under the condition of squelch clamping an increase in the R.F. carrier level is required.

Squelch circuitry including a single audio capture limiter typically is used to reduce squelch clamping. Although the limiter compensates for the noise rise resulting from modulation of the R.F. carrier signal and thus reduces squelch clamping, it also gives rise to squelch boost. The latter phenomenon is a condition of the squelch circuit which requires a decrease in R.F. carrier level to open the squelch circuit when modulation is added. Squelch boost requires corrective action which is opposite to that required by squelch clamping.

Additionally, the single audio limiter is inadequate in balancing boost and clamp characteristics since the amount of noise rise varies with modulation frequency and modulation deviation.

Another problem is that the audio limiter produces audio harmonics which fall within the noise sampling bandwidth. The audio harmonic power adds to sampled noise power which adds to squelch clamping.

SUMMARY OF THE INVENTION

Accordingly, it is an object of the present invention to provide a novel and improved squelch circuit having improved squelch sensitivity.

Another object of the invention is to minimize squelch clamping and squelch boost characteristics.

Another object of the invention is to provide operation of the squelch circuit independently of carrier modulation.

In accordance with the invention, a communications receiver squelch circuit is provided for preventing the receiver from producing audio-frequency output in the absence of a carrier signal. The squelch circuit of the invention includes first filter means adapted to receive a receiver discriminator output signal to develop a filtered signal. First limiter means are coupled to said first filter means for limiting said filtered signal to produce a amplitude limited, filtered signal. Second filter means are coupled to said first limiter means and are adapted to receive said amplitude limited, filtered signal to develop a second filtered signal. Second limiter means are coupled to said second filter means for limiting said second filtered signal to produce a second amplitude limited, filtered signal. Third filter means are coupled to said second limiter means and adapted to receive said second amplitude limited, filtered signal to develop a third filtered signal. Detector means are coupled to said third filter means for detecting peaks in said third filtered signal which exceed a predetermined amplitude to produce a squelch control voltage.

Said second limiter means and said second filter means, in combination, are effective to eliminate squelch clamping due to audio harmonics. In addition, the squelch circuit is effective to minimize squelch boost.

DETAILED DESCRIPTION OF THE PREFERRED EMBODIMENT

Figure 1:
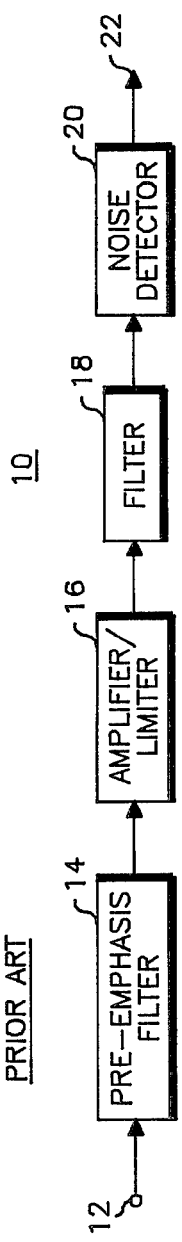
FIG. 1 is a block diagram representing a prior art squelch circuit.

Referring to FIG. 1, there is shown a block diagram of a prior art squelch circuit designated generally by the reference character 10. This prior art circuit 10 typically is utilized with any communications receiver employing a wide band discriminator. Signals from a receiver discriminator are applied to an input 12 of a pre-emphasis filter 14 which emphasizes a band of high frequency noise. The filtered signal is applied to an amplifier/limiter 16. Amplifier/limiter 16 clips the filtered signal and limits the amplitude of the noise peaks, thereby compensating for the noise increase that normally results from modulation of the R.F. carrier signal.

The clipped, filtered signal from amplifier/limiter 16 is coupled through a second filter 18 to a noise detector 20. Noise detector 20 detects peaks in the filtered signal which exceed a predetermined amplitude or threshold level. A squelch control voltage 22 is produced by noise detector 20 corresponding to the detected peaks exceeding the threshold level.

Prior art squelch circuit 10 illustrates a standard approach in providing squelch action wherein a single audio capture limiter 16 is employed. The squelch circuit according to the invention is provided to eliminate the previously discussed problems of squelch clamping and squelch boost with such conventional squelch circuitry.

Figure 2:
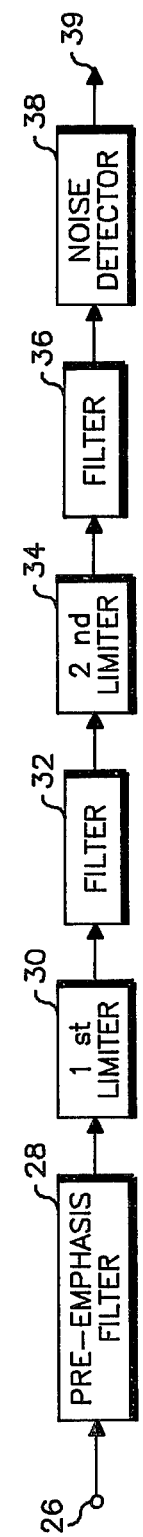
FIG. 2 is a block diagram of a squelch circuit in accordance with the invention.

Referring to FIG. 2, there is shown a block diagram representing the communications receiver squelch circuit according to the invention and designated generally by the reference character 24. Squelch circuit 24 includes a signal input 26 of a pre-emphasis filter 28, first limiter 30, filter 32, second limiter 34, filter 36, noise detector 38 and squelch output control voltage 39.

Signals from a receiver discriminator are applied to the input 26 of the pre-emphasis filter 28. This filter is used as in prior art squelch circuitry to filter the signals from the receiver discriminator such that audio is allowed to pass. For example, pre-emphasis filter 28 can be provided with a 6DB per octave pre-emphasis curve, extending through the frequency range of 5KHz through 20KHz. Filter 28 increases the sampled noise power in the selected frequency band.

The filtered signal from pre-emphasis filter 28 is applied to first limiter 30, which provides soft limiting of noise and audio signals. This limiting action produces audio harmonic power which adds to the sampled noise power which could result in squelch clamping as in the prior art squelch circuitry.

The limited, filtered signal produced by first limiter 30 is applied to filter 32. Filter 32 is a single pole, high pass filter. The corner frequency of filter 32 is selected such that a 6DB per octave pre-emphasis curve is provided over the sampled noise power, the audio frequency passband and the audio harmonics. The filtered, limited signal is applied to second limiter 34. Second limiter 34 amplitude limits the audio/noise waveform. This limiting action reduces the amplitude of the audio harmonics and thereby negates the effects of having the audio harmonics pre-emphasized by filter 32.

The limited, filtered output with emphasized noise power of second limiter 34 is applied to filter 36. Filter 36 is preferably a two pole, high pass filter. The corner frequencies of filter 36 are provided sufficiently high to attenuate the audio signal. Filter 36 also pre-emphasizes the sampled noise power producing the desired noise spectrum for detection.

The filtered output of filter 36 is coupled to noise detector 38. Noise detector 38 produces a squelch control voltage 39 corresponding to detected peaks in the signal which exceed a predetermined amplitude or threshold level. A squelch switch (not shown) is employed to receive the squelch control voltage 39 and mute the receiver audio output accordingly.

The squelch circuit 24 provides improved squelch sensitivity, minimizes squelch clamping and squelch boost characteristics. In combination, filter 32 and second limiter 34 provide attenuation of the audio harmonics included in the signal produced by first limiter 30. This attenuation of the audio harmonics substantially eliminates squelch clamping otherwise caused by audio harmonics. Both squelch boost and squelch clamping can be provided at less than 1DB over the audio frequency range of, for example, 300 Hz to 3KHz.

Figure 3:
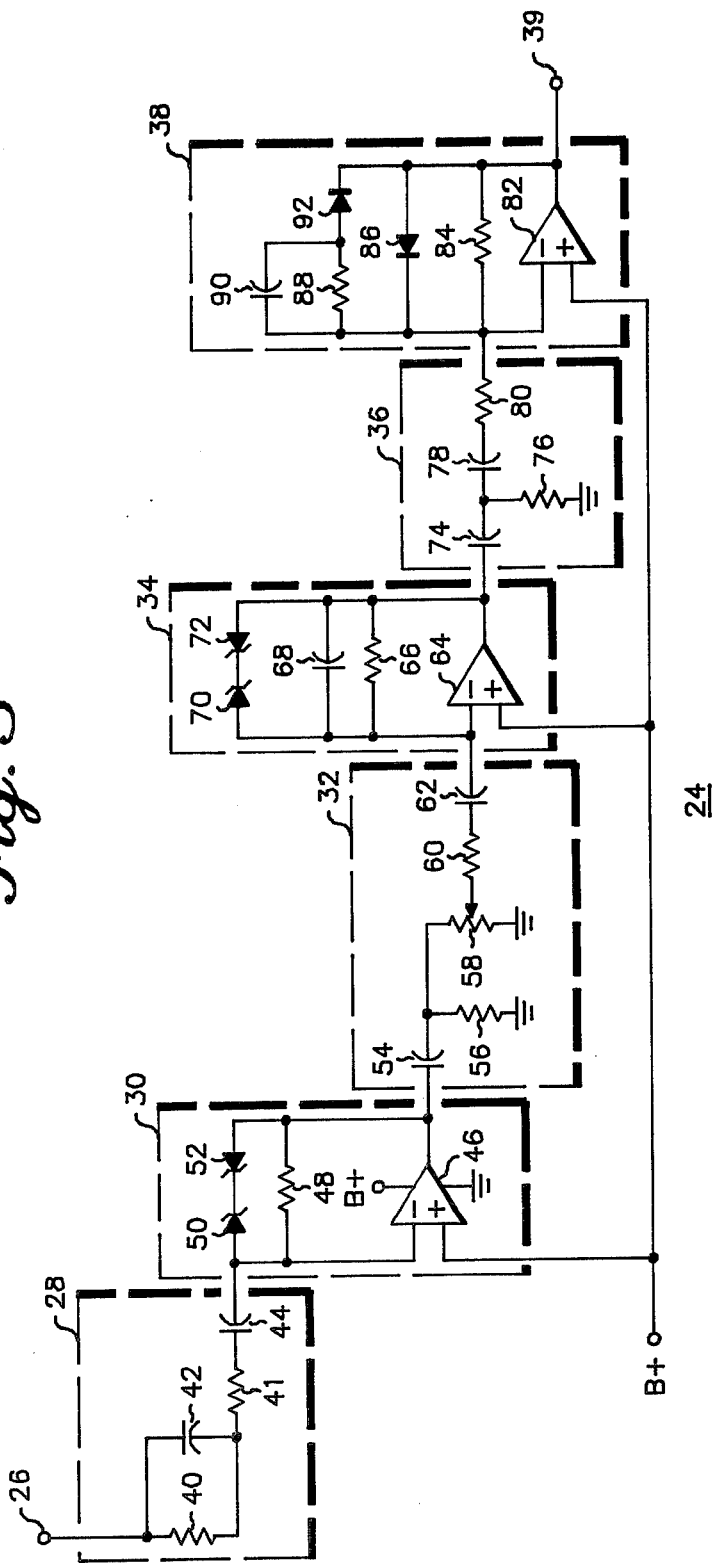
FIG. 3 is a schematic diagram of the squelch circuit illustrated in FIG. 2.

Referring now to FIG. 3, there is shown a schematic diagram of the squelch circuit 24 as shown in block diagram in FIG. 2. In the circuit 24 of FIG. 3, wideband signals from a receiver discriminator are applied to the input 26 of pre-emphasis filter 28.

Resistors 40, 41 and capacitors 42, 44 are connected as shown to form pre-emphasis filter 28. The output of filter 28 is applied to first limiter 30 which includes an operational amplifier 46 having a feedback circuit formed of resistor 48 and zener diodes 50, 52 connected as shown. Operational amplifier 46 preferably is provided with a high slew rate. Zener diodes 50, 52 may have, for example, a 2.6 volt breakdown voltage and are operated on the knee of their saturation curve. The amplitude limited signal output of first limiter 30 is applied to filter 32. Filter 32 is formed of capacitors 54, 62 and resistors 56, 58, 60 connected as shown. Resistor 58 is a variable potentiometer and is varied to determine the portion of the signal applied to second limiter 34, thereby determining the squelch sensitivity.

Second limiter 34 includes an operational amplifier 64 and the feedback circuit formed of resistor 66, capacitor 68 and zener diodes 70, 72 connected as shown. Capacitors 74, 78 and resistors 76, 80 are connected to form filter 36 following second limiter 34. The filtered signal output of filter 36 is applied to the noise detector 38. Operational amplifier 82 is provided with a feedback circuit including resistors 84, 88 capacitor 90 and diodes 86, 92 connected as shown to form the noise detector 38.

The circuit 24 illustrated in FIG. 3 is provided as an example only and various other combinations can be used to obtain a similar result without departing from the spirit or scope of the invention as defined in the appended claims.

What is claimed is:

1. A communications receiver squelch circuit for preventing the receiver from producing audio-frequency output in the absence of a frequency modulated carrier signal comprising:
    (a) first filter means adapted to receive a receiver discriminator output signal to develop a first filtered signal;
    (b) first limiter means coupled to said first filter means for limiting said first filtered signal to produce a first amplitude limited, filtered signal;
    (c) second filter means coupled to said first limiter means and adapted to receive said first amplitude limited, filtered signal to develop a second filtered signal;
    (d) second limiter means coupled to said second filter means for limiting said second filtered signal to produce a second amplitude limited, filtered signal;
    (e) third filter means coupled to said second limiter means and adapted to receive said second amplitude limited, filtered signal to develop a third filtered signal; and
    (f) detector means coupled to said third filter means for detecting peaks in said third filtered signal which exceed a predetermined amplitude to produce a squelch control voltage.

2. The communications receiver squelch circuit of claim 1 wherein said second filter means and said second limiter means, in combination provide attenuation of audio harmonics of said first limited, filtered signal.

3. The communications receiver squelch circuit of claim 1 wherein said second filter means includes means for varying the amplitude of said limited, filtered signal, thereby providing a variable squelch sensitivity.

4. The communications receiver squelch circuit of claim 1 wherein each of said first and second limiter means include at least one operational amplifier and feedback zener diodes.

5. In a communications receiver squelch circuit for preventing the receiver from producing audio-frequency output in the absense of a carrier signal, the squelch circuit including a pre-emphasis filter coupled to the receiver discriminator output signal and providing a filtered signal, a limiter coupled to the pre-emphasis filter and providing a amplitude limited filtered signal, and a noise detector coupled to the limiter through a detector filter, the improvement comprising:

filter means coupled the limiter and adapted to receive the amplitude limited, filtered signal to produce a second filtered signal whereby noise power is emphasized, and second limiter means coupled to said filter means for limiting said filtered signal to produce a second amplitude limited, filtered signal and coupled to the noise detector through the detector filter, whereby said second amplitude limited, filtered signal includes attenuated audio harmonics.

* * * * *